(12) United States Patent
Baron

(10) Patent No.: US 6,214,646 B1
(45) Date of Patent: Apr. 10, 2001

(54) SOLDERING OPTICAL SUBASSEMBLIES

(75) Inventor: Robert Anthony Baron, Mohrsville, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/515,474

(22) Filed: Feb. 29, 2000

(51) Int. Cl.$^7$ .................................................. H01L 21/58
(52) U.S. Cl. ........................... 438/119; 438/107; 438/652; 438/658
(58) Field of Search .................................. 438/107, 119, 438/FOR 211, FOR 343, 614, 658, 652

(56) References Cited

U.S. PATENT DOCUMENTS

| | | | |
|---|---|---|---|
| 3,821,785 | * | 6/1974 | Rose . |
| 4,335,501 | * | 6/1982 | Wickenden et al. . |
| 5,854,087 | * | 12/1998 | Kurata . |
| 5,885,849 | * | 3/1999 | DiStefano et al. . |
| 5,990,560 | * | 11/1999 | Coult et al. . |

* cited by examiner

Primary Examiner—George Fourson
Assistant Examiner—Joannie A. Garcia
(74) Attorney, Agent, or Firm—Thomas, Kayden, Horstemeyer & Risley LLP

(57) ABSTRACT

The specification describes a method for attaching semiconductor components to a substrate wafer by solder bump bonding using gold tin eutectic solder bumps. The process involves first forming solder stacks by blanket evaporation of a stack layer comprising a first layer of gold, a layer of tin and a second layer of gold, and patterning the stack layer by lift-off to form individual solder stacks. Attachment is effected by reflow of the solder stacks to bump bond the components to the substrate wafer. The quality of the bump bond is improved by annealing the multilayer stack, prior to reflow, to diffuse tin toward the stack surface.

7 Claims, 4 Drawing Sheets

SOLDERING OPTICAL SUBASSEMBLIES

FIELD OF THE INVENTION

This invention relates to techniques for bonding photonic components in optical subassemblies using gold-tin eutectic solder.

BACKGROUND OF THE INVENTION

In a typical Optical Sub-Assembly (OSA) a variety of component types, e.g. lasers, photodiodes, are attached to a single platform. The components are typically formed on semiconductor, usually III-V semiconductor, substrates and the platform is also usually a III-V semiconductor so that the thermo-mechanical characteristics of the platform matches those of the component substrates. The component substrates are attached to the platform substrate using solder bumps. The attachment technique should produce a reliable and cost-effective bond. Gold-tin solder is especially well suited for this application, and is the preferred means of attachment.

Several options are available for the solder preparation and solder bump bonding operations. In most gold-tin solder processes, the gold and tin are frequently deposited as separate layers. The preferred approach is to first deposit a gold-tin-gold stack. The gold-tin eutectic forms during reflow of the solder.

Electroplating techniques have been proposed for depositing the gold and tin layers on the substrates. This approach has the advantage of being a low cost, relatively well understood, process, capable of high volumes. However, there are several disadvantages in this approach, e.g., poor purity control of plated materials, high toxicity of the electrolytes, relatively large footprint of electroplating equipment.

STATEMENT OF THE INVENTION

I have developed a solder bump bonding technique for III–V components using gold-tin eutectic solder that relies on evaporation of the gold-tin-gold stack. It offers the advantage of forming the multilayer stack in a single apparatus, and avoids the drawbacks in electrolytic processing noted above. An important step in the process is heating the stack in the evaporator to cause diffusion of tin toward the surface of the stack. This promotes more effective eutectic formation during the solder bump bonding operation.

DETAILED DESCRIPTION

Figure 1:
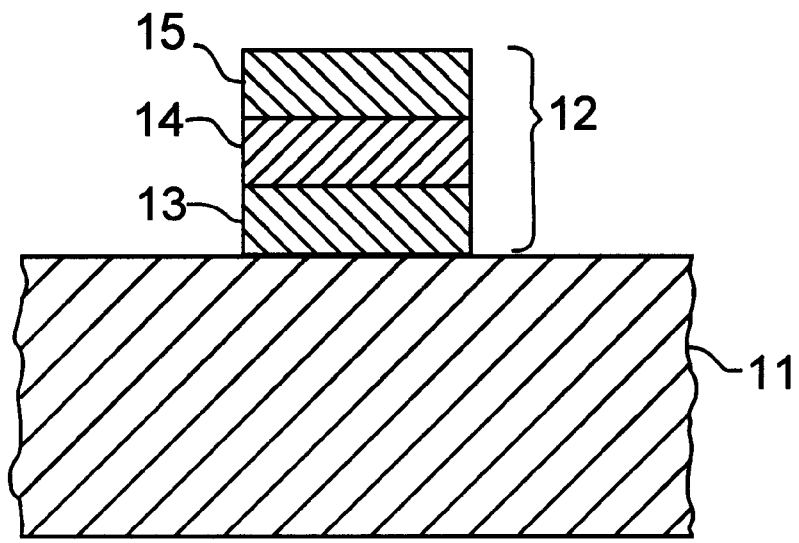
FIG. 1 is a schematic representation of a OSA platform with selective deposition of a gold-tin-gold solder stack.

With reference to FIG. 1, a semiconductor OSA substrate 11 is shown with a multilayer solder stack 12 applied to a selected region of the platform where a component is to be bonded. The OSA platform typically comprises a base of, e.g., sapphire (not shown) to which the semiconductor wafer is bonded. For simplicity in illustrating the invention, the figures show a cutaway portion of the semiconductor with a single attachment site, it being understood that several or many such attachment sites may be present on the whole device. It will also be understood that elements in the drawing are schematic and not to scale.

The solder stack 12 is deposited in three layers, a first gold layer 13, a tin layer 14, and a second gold layer 15. These layers are formed, according to a preferred embodiment of the invention, by sequential steps, in the same evaporator, of electron beam evaporation.

Figure 2:
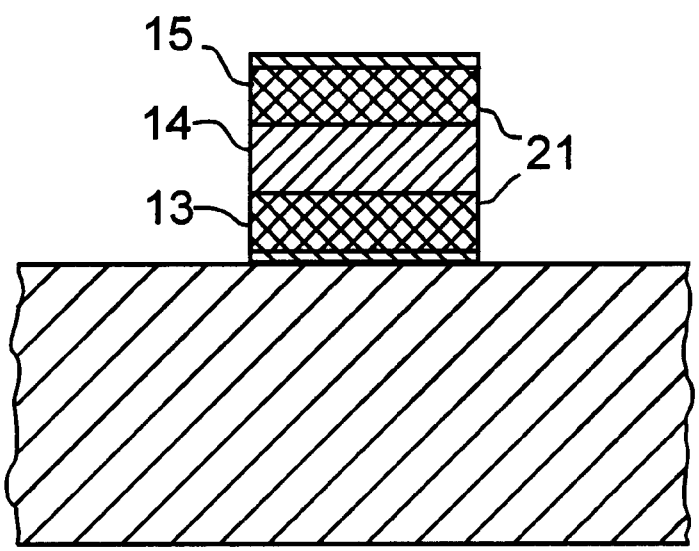
FIG. 2 is a schematic representation of the solder stack of FIG. 1 after tin diffusion according to the invention.

Attempts to bond components using the stack 12 of FIG. 1 frequently fail due to passivation effects on the surface of gold layer 15. This problem is overcome according to the invention by annealing the solder stack in the vacuum evaporator immediately after evaporation. The anneal treatment causes tin to diffuse into the gold layers as represented by FIG. 2. The diffusion of tin moves the presence of tin toward the surface of the gold layer 15 as shown. This diffusion step facilitates more effective and rapid formation of gold-tin eutectic in the solder bumps on reflow. The regions of tin diffusion are represented in FIG. 2 by hatched areas 21. The diffusion front of tin toward the gold layer surface may extend all the way to the surface of the gold layer, or as shown, may extend partly through the gold layer. It has been established experimentally that any significant diffusion of tin into the gold layer is beneficial to the process of the invention. Preferably, the diffusion step diffuses tin to at least within 0.2 $\mu$m of the surface of the stack.

Figure 3:
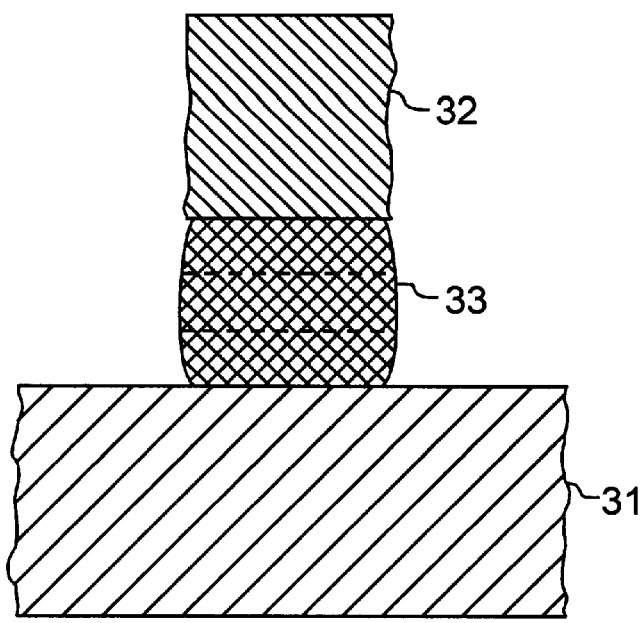
FIG. 3 is a schematic view of a component bonded to the OSA platform.

After the tin diffusion step, device component 32 to be attached (a portion of the device is shown) is mounted in contact with the surface of the stack, as shown in FIG. 3. Heat is applied to substrate 31 to reflow the solder stack and form the gold-tin eutectic solder bond 33 as shown.

A series of process steps for carrying out the invention set forth above will be described in connection with the fabrication of a PIN photodetector. These steps are presented by way of example and are not intended as limiting. It will be apparent to those skilled in the art that the attachment technique of the invention is appropriate for use in attaching a wide variety of OSA components to suitable platforms.

The platform in the process sequence described here is prepared by attaching an InP wafer to a sapphire disk using glycol phthalate wax. The InP substrate is thinned using conventional polishing techniques. In this sequence the InP substrate is thinned from 20 mils to 6 mils in two steps. In the first step, a Logitech® LP50 polishing station with a 9 $\mu$m slurry of alumina powder is used to thin the wafer from 20 mils to 7.2 mils. This is a relatively aggressive thinning step that leaves surface damage on the wafer. The surface damage is removed in the same equipment using a Rodell polishing pad and a polishing slurry of Clorox® and 0.3 $\mu$m alumina. The final wafer thickness is approximately 6 mils.

Figure 4:
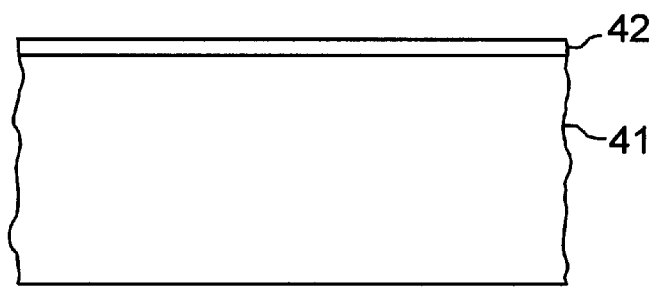
FIGS. 4–11 are schematic drawings representing process steps for producing a solder bump bonded assembly according to the invention.
Figure 5:
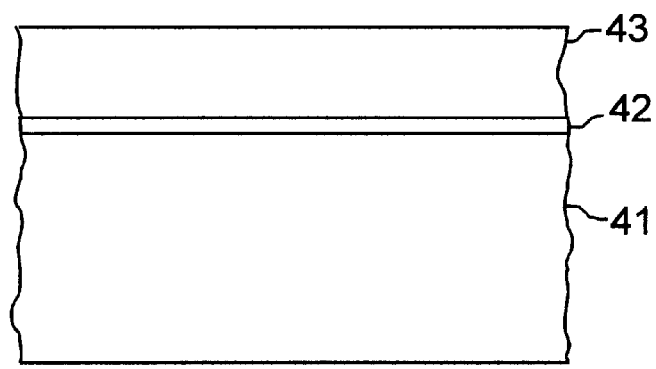
Figure 6:
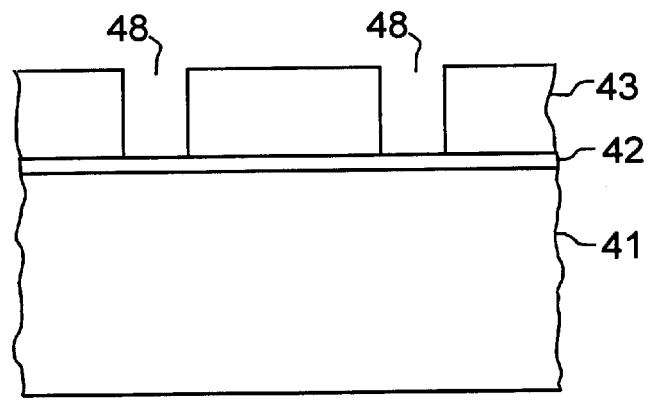
Figure 7:
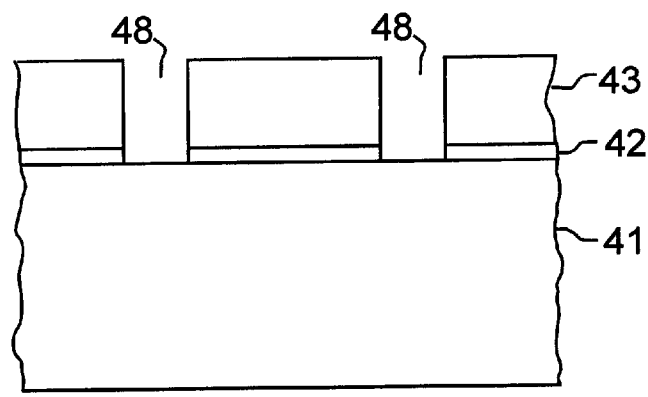

The wafer is then cleaned, and remounted. Next, a 0.1 to 0.4 $\mu$m layer of silicon oxynitride is deposited on the wafer using plasma enhanced chemical vapor deposition (PECVD). The silicon oxynitride layer has a nominal composition $Si_3ON_4$ and serves as an anti-reflection coating in the final device. It also serves to define the solder bump area since it does not wet with gold-tin solder. With reference to FIG. 4, InP wafer 41 is shown with silicon oxynitride layer 42 blanket deposited on the surface of wafer 41. A photoresist masking layer 43 is spin-coated on the silicon oxynitride layer as shown in FIG. 5. The photoresist is patterned, as shown in FIG. 6, to form mask features 48, and the exposed portions of the silicon oxynitride layer are etched to the InP substrate as shown in FIG. 7. The silicon oxynitride layer may be wet etched with buffered HF, or dry etched using RIE. The openings accommodate substrate contacts to the device being attached.

Figure 8:
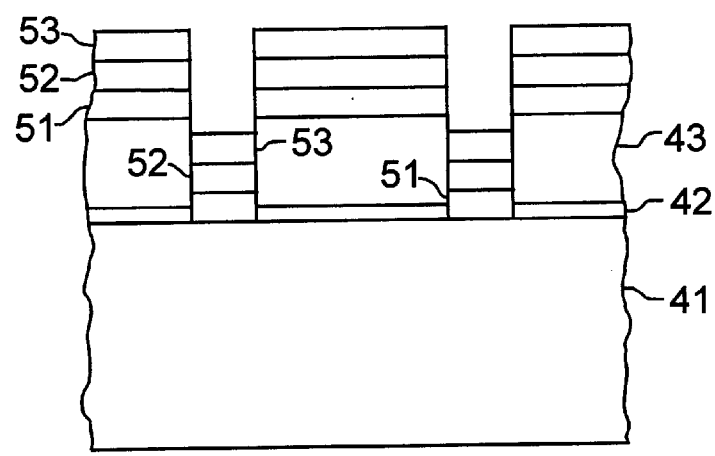

The solder stacks are then formed by blanket deposition of the multilayers, as shown in FIG. 8. The three layers of the stack, i.e. gold layer 51, tin layer 52, and gold layer 53, are all deposited in one operation in an e-beam chamber evacuated to a base pressure of 5.0 E$^{-7}$ Torr. Deposition temperature is in the range 100–120° C. The gold layer 51 is 0.5 to 2.0 μm in thickness, and forms a strong reliable bond to the InP substrate as well as a high quality electrical interface. The gold layer 51, the tin layer 52, and the gold capping layer 53 are deposited sequentially in the vacuum evaporator without breaking vacuum. This insures clean interfaces between the layers, and also contributes to the overall simplicity and efficiency of the process. The gold layer 53 preferably has a thickness in the range 0.2–1.5 μm. The function of this top gold layer is to cap the tin layer during processing and prevent formation of unwanted surface oxides that impair proper solder stack reflow, and thereby interfere with reliable bond formation.

The thickness of the tin layer is determined relative to the thickness of the gold layers so as to produce a gold-tin alloy. The preferred gold-tin alloy composition is 24% tin. However, variations of the order of ±15% from that value give acceptable results. To achieve this gold-tin ratio, the combined thickness of the two gold layers relative to the thickness of the tin layer should be in the ratio range 0.9 to 1.1, and preferably be 1.0. The thickness of the gold may be split between the two gold layers 51/53 in a range of ratios preferably varying from 0.5 to 1.5. This prescription can be expressed approximately by:

$$g_1 + g_2 = t \pm 15\%$$

where $g_1$ is the thickness of the first gold layer, $g_2$ is the thickness of the second gold layer, and t is the thickness of the tin layer. It is preferred that the overall thickness of the solder stack be in the range 1.5–4 μm.

The initial wafer temperature for the evaporation sequence may be room temperature or the evaporation temperature range given above, i.e. 100–120° C. The wafer is heated during evaporation. In the preferred process the temperature is cycled to allow cooling of the wafer between evaporation of the three layers. It was found that this temperature cycle allows the layers to remain as relatively separate layers and prevents the formation of AuSn$_4$ compounds which are very brittle and may occur if the concentration of tin at the gold-tin interfaces is allowed to reach 58% or higher. Accordingly, after evaporating layer 51, the wafer is cooled by at least 40° C., and reheated for deposition of layer 52. Likewise, after evaporation of layer 52 is complete, the wafer is allowed to cool again by at least 40° C., and reheated for deposition of layer 53.

Figure 9:
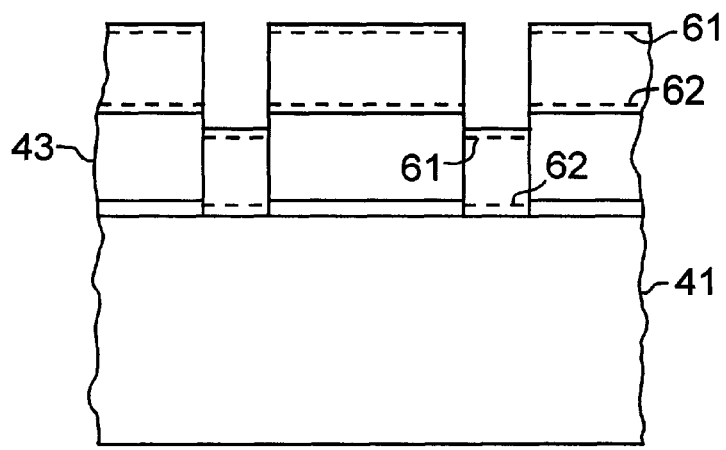

After deposition of the second gold layer 53, the stack is annealed to diffuse tin into the gold layers. This step is represented by FIG. 9, which shows diffusion boundaries 61 and 62 where tin has diffused into the gold layers of the multi-layer stack. For the anneal, the wafer is held at a temperature in the range 150–180° C. for 1 to 2 minutes. Experimental evidence establishes that this step is critical to forming reliable bonds with high yield. As mentioned previously, the stack anneal step may diffuse tin through the entire thickness of the gold layer, or partially through the gold layer as shown in FIG. 9. Again, it is preferred that the diffusion boundary of tin extend at least to within 0.2 μm of the surface of the stack.

Figure 10:
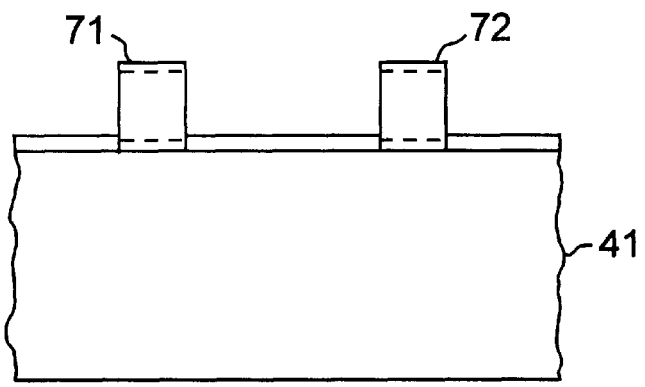

After the stack anneal step, the unwanted portions of the stack layers are removed using lift-off to produce the selectively deposited stacks 71 and 72 as shown in FIG. 10. The lift-off is achieved in the conventional manner by removing the photoresist layer with e.g., acetone, which lifts away the topmost surface portions of the multi-layer stack.

Figure 11:
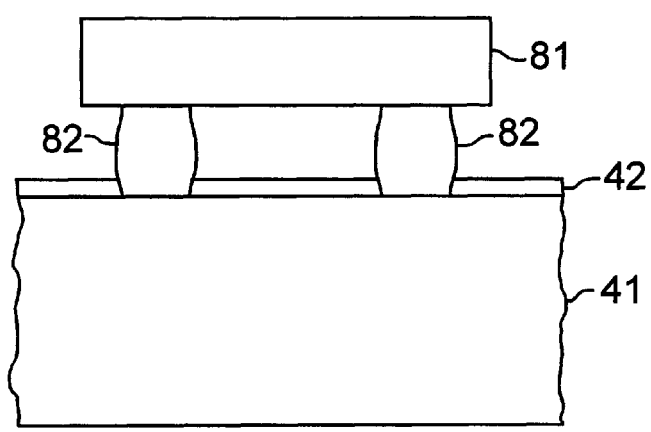

The wafer assembly at this point is ready for component mounting and reflow. A component 81 is shown in FIG. 11, attached to substrate 41 with gold-tin solder bumps 82. The reflow step is accomplished by heating the wafer assembly to a temperature of e.g. 340–350° C., which melts and reflows the gold-tin solder stacks and forms solder bumps 82. The solder bumps are confined to the windows in the silicon oxynitride layer 42 due to the non-wetting properties of the silicon oxynitride layer.

Whereas this description is largely in terms of Inp devices, other semiconductor devices, with e.g. GaAs, or other III-V binary, ternary or quaternary compounds, may also be treated in accordance with the principles of the invention.

Varies additional modifications of this invention will occur to those skilled in the art. All deviations from the specific teachings of this specification that basically rely on the principles and their equivalents through which the art has been advanced are properly considered within the scope of the invention as described and claimed.

I claim:

1. Method for attaching semiconductor components to a substrate wafer by solder bump bonding comprising the steps of:
   (a) applying a photoresist layer on the substrate wafer,
   (b) patterning the photoresist layer to form windows in the photoresist layer, the windows exposing contact portions of the substrate wafer
   (c) forming a solder stack layer on the photoresist layer and on the contact portions of the substrate wafer by placing the wafer substrate in a vacuum chamber, evacuating the chamber, heating the wafer substrate, and conducting the following steps sequentially in the vacuum chamber:
       (i) depositing a first layer of gold on the substrate wafer,
       (ii) depositing a layer of tin on the first layer of gold,
       (iii) depositing a second layer of gold on the layer of tin, and
       (iv) heating the substrate wafer and the solder stack layer to a temperature and for a time sufficient to diffuse tin into the first and second layers of gold,
   (d) removing the photoresist layer and the solder stacks on the photoresist layer leaving solder stacks covering the contact portions of the substrate wafer,
   (e) mounting the semiconductor components in contact with the solder stacks, and
   (f) heating the solder stacks to reflow the solder stacks and form solder bump attachments between the semiconductor components and the wafer substrate.

2. The method of claim 1 wherein the wafer substrate is InP.

3. The method of claim 1 including the additional steps of: after step (i), cooling the wafer by at least 40° C., and after step (ii), cooling the wafer by at least 40° C.

4. The method of claim 1 wherein step (iv) is conducted by holding the wafer substrate at a temperature in the range 150–180° C. for a period of 1 to 2 minutes.

5. The method of claim 4 wherein the thickness of the tin layer is equal to 0.9 to 1.1 of the combined thickness of the first gold layer and the second gold layer.

6. Method for attaching semiconductor components to an InP wafer by solder bump bonding comprising the steps of:

(a) depositing a layer of silicon oxynitride on the InP wafer, (b) applying a photoresist layer on the substrate wafer, (c) patterning the photoresist layer to form windows in the photoresist layer, the windows exposing portions of the silicon oxynitride layer, (d) etching the portions of the silicon oxynitride layer exposed in step (c) to expose contract portions of the InP wafer, forming a plurality of solder stacks by the steps of:

(e) heating the InP wafer to a temperature in the range 100–120° C., (f) evaporating a first layer of gold on the photoresist layer and on the contact portions of the InP wafer, said first layer of gold having a thickness $g_1$, (g) cooling the InP wafer by at least 40° C.

(h) heating the InP wafer to a temperature in the range 100–120° C., (i) evaporating a layer of tin on the first layer of gold, said layer of tin having a thickness t, (j) cooling the InP wafer by at least 40° C.

(k) heating the InP wafer to a temperature in the range 100–120° C., (l) evaporating a second layer of gold on the tin layer, said second layer of gold having a thickness $g_2$, where:

$$g_1 + g_2 = t \pm 15\%$$

(m) annealing the InP wafer at a temperature in the range 150–180° C. for a period of 1 to 2 minutes to diffuse tin into the first and second layers of gold wherein the solder stacks are formed, (n) removing the photoresist layer leaving the plurality of solder stacks covering the contact portions of the InP wafer, (o) mounting the semiconductor components in contact with the solder stacks, and (p) heating the solder stacks to reflow the solder stacks and form solder bump attachments between the semiconductor components and the InP substrate.

7. Method for attaching semiconductor components to a substrate wafer by solder bump bonding comprising the steps of:

(a) applying a photoresist layer on an InP substrate wafer, (b) patterning the photoresist layer to form windows in the photoresist layer, the windows exposing contact portions of the substrate wafer, (c) forming a solder stack layer on the photoresist layer and on the contact portions of the substrate wafer by placing the wafer substrate in a vacuum chamber, evacuating the chamber, heating the wafer substrate, and conducting the following steps sequentially in the vacuum chamber:

(i) depositing a first layer of gold on the substrate wafer, (ii) depositing a layer of tin on the first layer of gold, (iii) depositing a second layer of gold on the layer of tin, and (iv) heating the substrate wafer and the solder stack layer to a temperature in the range 150–180° C. for a period of 1–2 minutes, (d) removing the photoresist layer and the solder stacks on the photoresist layer leaving solder stacks covering the contact portions of the substrate wafer, (e) mounting the semiconductor components in contact with the solder stacks, and (f) heating the solder stacks to reflow the solder stacks and form solder bump attachments between the semiconductor components and the wafer substrate.

* * * * *